United States Patent
Pedersen

(10) Patent No.: US 6,169,417 B1
(45) Date of Patent: Jan. 2, 2001

(54) PRODUCT-TERM MACROCELLS FOR PROGRAMMABLE LOGIC DEVICE

(75) Inventor: Bruce B. Pedersen, San Jose, CA (US)

(73) Assignee: Altera Corporation, San Jose, CA (US)

(*) Notice: Under 35 U.S.C. 154(b), the term of this patent shall be extended for 0 days.

(21) Appl. No.: 09/238,101

(22) Filed: Jan. 27, 1999

Related U.S. Application Data

(60) Provisional application No. 60/086,432, filed on May 22, 1998.

(51) Int. Cl.[7] .................... H03K 19/177; H03K 19/173
(52) U.S. Cl. .................... 326/40; 326/41; 326/46
(58) Field of Search .................... 326/37–41, 46, 326/52

(56) References Cited

U.S. PATENT DOCUMENTS

| | | | |
|---|---|---|---|
| 5,121,006 | 6/1992 | Pedersen | 326/38 |
| 5,220,214 * | 6/1993 | Pedersen | 326/46 |
| 5,821,774 * | 10/1998 | Veytsman et al. | 326/39 |
| 5,969,539 * | 10/1999 | Veytsman et al. | 326/39 |
| 5,986,465 * | 11/1999 | Mendel | 326/39 |
| 6,034,540 * | 3/2000 | Mendel | 326/39 |

* cited by examiner

*Primary Examiner*—Michael Tokar
*Assistant Examiner*—Daniel D. Chang
(74) *Attorney, Agent, or Firm*—Fish & Neave; Robert R. Jackson

(57) ABSTRACT

An improved macrocell for sum-of-products logic allows independent selection of D or T flip-flop operation, inverted or non-inverted register input, and use of a product term in register input control. The macrocell circuitry for providing this enhanced functionality can be implemented using only a small number of transistors greater than the number typically used to implement less flexible prior art macrocells.

20 Claims, 4 Drawing Sheets

| LINE # | R4 | R3 | XOR_PT/GND | XOR_CTRL |
|---|---|---|---|---|
| 1 | 0 | 0 | GND | VCC |
| 2 | 0 | 1 | GND | GND |
| 3 | 0 | 0 | PT | $\overline{PT}$ |
| 4 | 0 | 1 | PT | PT |
| 5 | 1 | 0 | GND | $\overline{Q}$ |
| 6 | 1 | 1 | GND | Q |
| 7 | 1 | 0 | PT=0 | $\overline{Q}$ |
| 8 | 1 | 0 | PT=1 | Q |
| 9 | 1 | 1 | PT=0 | Q |
| 10 | 1 | 1 | PT=1 | $\overline{Q}$ |

PRODUCT-TERM MACROCELLS FOR PROGRAMMABLE LOGIC DEVICE

This application claims the benefit of United States provisional patent application No. 60/086,432, filed May 22, 1998.

BACKGROUND OF THE INVENTION

This invention relates to programmable logic devices, and more particularly product term ("p-term") macrocells for programmable logic devices.

Pederson U.S. Pat. No. 5,121,006 ("the '006 patent") shows a p-term-based macrocell for use in programmable logic devices. The '006 patent macrocell is capable of providing the logical OR of N p-terms. In the '006 patent N is up to five, but N can be any number smaller or larger than five as desired. Also in he '006 patent the sum-of-products output of the above-mentioned logical OR can be optionally subjected logical EXCLUSIVE OR combination with any one of the following signals: (1) a p-term, (2) a feedback output ("Q") from a register in the macrocell, (3) the logical inverse ("Q-bar") of the just-mentioned feedback, (4) fixed logic 1 potential ("VCC"), or (5) fixed logic 0 potential ("GND"). The ability to select one of the EXCLUSIVE OR inputs (sometimes referred to herein as the "XOR Control" or "XOR_CTRL" input) from among Q-bar, Q, VCC, or GND allows the '006 patent macrocell to implement D or T flip-flops, and also allows inversion control on the input to the register. However, when the XOR Control input is tied to a product term, the '006 patent macrocell loses the ability to select between the D or T flip-flop. Inversion control on the input to the register is also Lost.

In view of the foregoing, it is an object of this invention to provide improved p-term macrocells for programmable logic devices.

It is a more particular object of this invention to provide p-term macrocells for programmable logic devices which allow both inversion control and D/T flip-flop selection even when a p-term is used as a contributor to the XOR Control input.

SUMMARY OF THE INVENTION

These and other objects of the invention are accomplished in accordance with the principles of the invention by providing a p-term macrocell of the general type shown in the '006 patent but with modification of circuitry for providing the XOR Control input. A preferred embodiment of the XOR Control input circuitry of this invention includes NAND circuitry configured to provide the logical NAND of Q and the output signal of a first programmable function control element ("FCE"). This embodiment further includes first EXCLUSIVE OR circuitry configured to provide the logical EXCLUSIVE OR of the output signal of the above mentioned NAND circuitry and the output signal of a second FCE. The embodiment being described still further includes second EXCLUSIVE OR circuitry configured to provide the logical EXCLUSIVE OR of the output signal of the first EXCLUSIVE OR circuitry and a signal which is selectable (typically programmably selectable) as either a p-term or GND. The output signal of the second EXCLUSIVE OR circuitry is the XOR Control signal.

If desired, the modified XOR Control input circuitry of this invention can be implemented using a number of transistors which is only slightly greater than the number of transistors needed for the '006 patent XOR Control input circuitry.

Further features of the invention, its nature and various advantages will be more apparent from the accompanying drawings and the following detailed description of the preferred embodiments

BRIEF DESCRIPTION OF THE DRAWINGS

FIG. 3 is a table summarizing various possible operating conditions of the FIG. 2 circuitry.

DETAILED DESCRIPTION OF THE PREFERRED EMBODIMENTS

Figure 1:
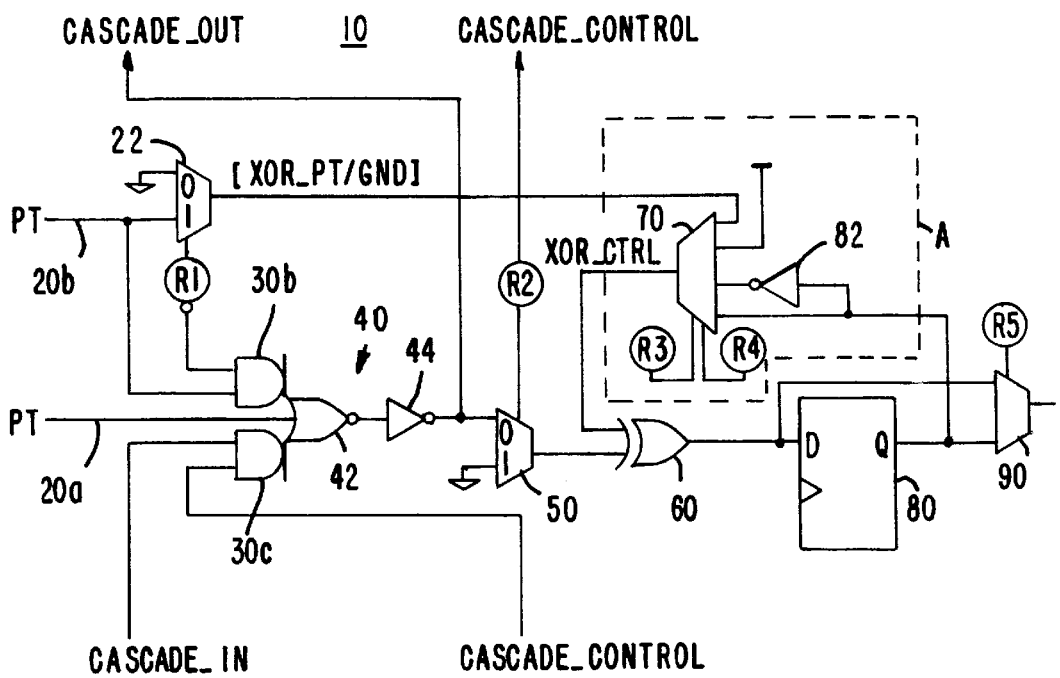
FIG. 1 is a simplified schematic block diagram of macrocell circuitry of the type shown in the '006 patent.

Typical circuitry for a p-term macrocell 10 of the type shown in the '006 patent is shown in FIG. 1. Macrocell 10 is assumed to have two p-term inputs 20a and 20b, but more p-terms (like 20a and therefore feeding OR circuitry 40) can be added if desired. In the particular embodiment shown in FIG. 1 OR circuitry 40 is implemented by a NOR gate 42 followed by an inverter 44, but in the interest of brevity these elements will sometimes be referred to collectively as OR circuitry 40.

Assuming that logical AND circuitry 30b is enabled by the applied output signal of programmable function control element ("FCE") RI, OR circuitry 40 can provide an output signal which is the logical OR of p-terms 20a and 20b. OR circuitry 40 also receives the output of logical AND circuitry 30c, which can be a Cascade In signal from another similar macrocell if the FCE R2 in that other macrocell is programmed to provide an AND-enabling Cascade Control input signal to AND circuitry 30c. The output signal of OR circuitry 40 can therefore be any of the following: (1) p-term 20a alone (if FCE R1 disables AND circuitry 30b and the Cascade Control input to AND circuitry 30c disables that circuitry), (2) the logical OR of p-terms 20a and 20b (if AND circuitry 30b is enabled but AND circuitry 30c is not), (3) the logical OR of p-term 20a and the Cascade In signal (if AND circuitry 30c is enabled but AND circuitry 30b is not), or (4) the logical OR of p-terms 20a and 20b and the Cascade In signal (if both of AND circuitries 3b and 30c are enabled).

The output signal of OR circuitry 40 is applied to one input terminal of programmable logic connector ("PLC") 50 (e.g., a multiplexer) and is also the Cascade Out signal of the depicted macrocell. The Cascade Out signal of one macrocell is the Cascade In signal of another macrocell. PLC 50 is programmably controlled by FCE R2 to apply either the output signal of OR circuitry 40 or a fixed logic 0 (VSS or ground ("GND")) signal to one input terminal of EXCLUSIVE OR circuitry 60. The other input to EXCLUSIVE OR circuitry 60 is an XOR Control signal output by PLC 70. PLC 70 is programmably controlled by FCEs R3 and R4 to select one of the following four signals as the XOR Control signal: (1) the Q output signal of register circuitry 80, (2) the logical inverse of Q ("Q-bar") output by inverter 82, (3) fixed logic 1 (VCC), or (4) the output signal of PLC 22. PLC 22 is programmably controlled by FCE R1 to output either p-term input 20b or fixed logic 0 (VSS or GND). Thus PLCs 22 and 70 collectively allow the XOR Control signal to be any one of Q, Q-bar, VCC, p-term 20b, or GND. PLC 90 is programmably controlled by FCE R5 to select as the primary output signal of the macrocell either Q or the unregistered output signal of EXCLUSIVE OR circuitry 60.

As the '006 patent says, by properly selecting the inputs to EXCLUSIVE OR circuitry 60, register circuitry 80 can be used to implement D or T flip-flops with inversion control on the D or T inputs. Considering first implementation of a D flip-flop, register circuitry 80 responds to a clock signal pulse by storing the signal that is then being applied to its D input terminal. This signal is the output of EXCLUSIVE OR circuitry 60 and can be any of several possibilities such as (1) the sum-of-products output signal of OR circuitry 40, either inverted (XOR Control signal logic 1) or not inverted (XOR Control signal logic 0), or (2) p-term 20b (selected via PLCs 22 and 70 and passed uninverted by EXCLUSIVE OR circuitry 60 due to PLC 50 being programmed to apply logic 0 to the other input terminal of EXCLUSIVE OR circuitry 60). In case (1) immediately above, the XOR Control signal can be logic 1 either as a result of PLC 70 being programmed to output VCC, or as a result of PLCs 22 and 70 being programmed to pass p-term 20b and that p-term having a logic 1 value. Similarly in case (1) immediately above, the XOR Control signal can be logic 0 either as a result of PLCs 22 and 70 being programmed to pass GND, or as a result of those PLCs being programmed to pass p-term 20b and that p-term having a logic 0 value. Thus the inversion control described above can be either "programmed" (or fixed) (i.e., due to selection of VCC or GND) or dynamic (i.e., due to selection of p-term 20b).

For register circuitry 80 to implement a T flip-flop, PLC 70 is programmed to feed back either Q or Q-bar. If Q is fed back, register 80 will toggle in response to each clock pulse as long as the output signal of PLC 50 is logic 1. Register 80 will not toggle while the output signal of PLC 50 is logic 0. If Q-bar is fed back, register 80 will toggle in response to each clock pulse while the output signal of PLC 50 is logic 0, but not when that signal is logic 1.

From the foregoing, it will be seen that if p-term 20b must be applied to EXCLUSIVE OR circuitry 60, the T flip-flop option is no longer available. Also, if p-term 20b must be applied to EXCLUSIVE OR circuitry 60, programmed inversion control (i.e., based on selection of VCC or GND) on the input to register circuitry 80 is no longer available.

Figure 2:
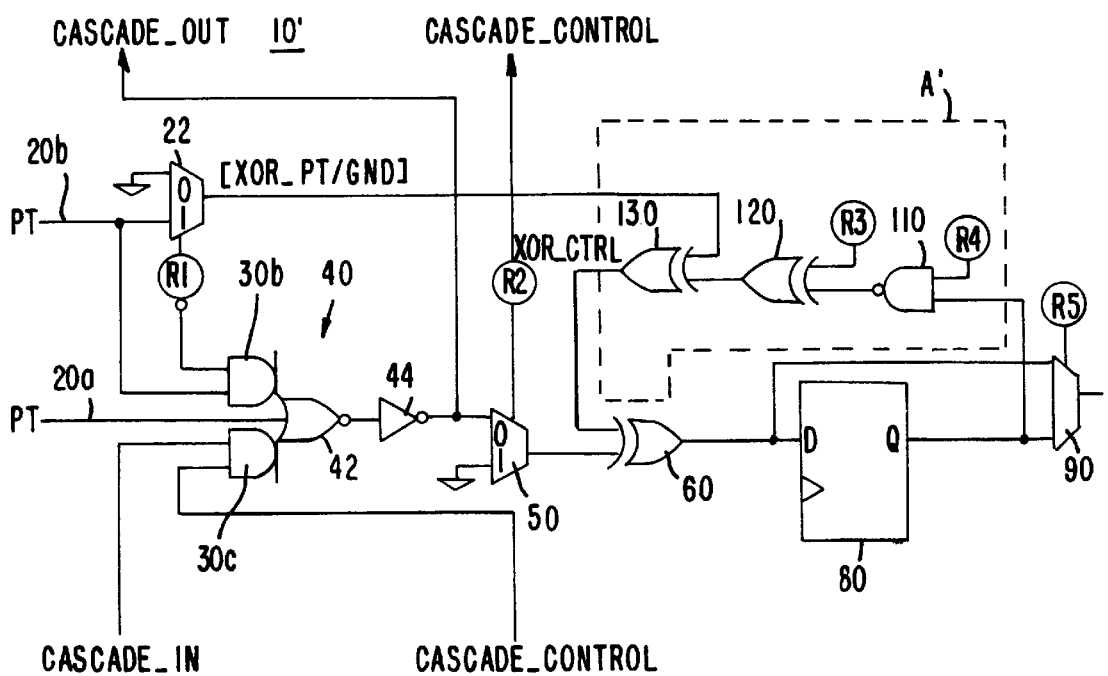
FIG. 2 is a simplified schematic block diagram showing illustrative modification of the FIG. 1 circuitry in accordance with this invention.

FIG. 2 shows an illustrative embodiment of modification of the FIG. 1 circuitry in accordance with this invention so that when it is desired to use p-term 20b, the T flip-flop option and programmed inversion control are not lost. In FIG. 2 elements 70 and 82 used in FIG. 1 are effectively replaced by elements 110, 120 and 130. In all other respects the circuitry of FIG. 2 may be the same as the circuitry of FIG. 1.

As shown in FIG. 2 the Q output signal of flip-flop 80 is applied to one input terminal of logical NAND circuitry 110. The output signal of FCE R4 is applied to the other input terminal of NAND circuitry 110. Accordingly, the programmed state of FCE R4 controls whether or not NAND circuitry 110 passes Q. If FCE R4 is programmed logic 1, NAND circuitry 110 passes Q with logical inversion (i.e., to Q-bar). If FCE R4 is programmed logic 0, the output signal of NAND circuitry 110 is fixed logic 1.

The output signal of NAND circuitry 110 is applied to one input terminal of logical EXCLUSIVE OR ("XOR") circuitry 120. The output signal of FCE R3 is applied to the other input terminal of XOR circuitry 120. If the output signal of NAND circuitry 110 is Q-bar, the programmed state of FCE R3 determines whether the output signal of XOR circuitry 120 is Q or Q-bar (i.e., if FCE R3 is logic 0, the output of XOR circuitry 120 is Q-bar; but if FCE R3 is logic 1, the output signal of XOR circuitry 120 is Q). On the other hand, if the output signal of NAND circuitry 110 is fixed logic 1, the output signal of XOR circuitry 120 is either fixed logic 1 (when FCE R3 is logic 0) or fixed logic 0 (when FCE R3 is logic 1).

The output signal of XOR circuitry 120 is applied to one input terminal of logical XOR circuitry 130. The other input to XOR circuitry 130 is the XOR_PT/GND output signal of PLC 22 (i.e., either p-term 20b or fixed logic 0 (GND)). If the output signal of XOR circuitry 120 is fixed logic 1 and the output signal of PLC 22 is GND, then the output signal of XOR circuitry 130 is fixed logic 1 (VCC). This corresponds to the condition shown in line 1 of FIG. 3. If the output signal of XOR circuitry 120 is fixed logic 0 and the output signal of PLC 22 is GND, the output signal of XOR circuitry 130 is fixed logic 0 (GND). This corresponds to the condition shown in line 2 of FIG. 3. If the output signal of XOR circuitry 120 is Q-bar and the output signal of PLC 22 is GND, the output signal of XOR circuitry 130 is Q-bar. This corresponds to the condition shown in line 5 of FIG. 3. If the output signal of XOR circuitry 120 is Q and the output signal of PLC 22 is GND, the output signal of XOR circuitry is Q. This corresponds to the condition shown in line 6 of FIG. 3.

Lines 7–10 of FIG. 3 show that if the output signal of XOR circuitry 120 is Q or Q-bar and the output signal of PLC 22 is p-term 20b, the logical state of p-term 20b can be used to control XOR circuitry 130 to selectively invert the Q or Q-bar signal from XOR circuitry 120. For example, lines 7 and 8 in FIG. 3 show the effect of the logical state of p-term 20b on a Q-bar output from XOR circuitry 120. Lines 9 and 10 in FIG. 3 show the effect of the logical state of p-term 20b on a Q output from XOR circuitry 120.

From the foregoing it will be seen that the FIG. 2 circuitry allows simple programmed control of whether or not XOR circuitry 60 inverts the output signal of PLC 50. This is shown by lines 1 and 2 of FIG. 3, wherein when the XOR_CTRL output signal of XOR circuitry 130 is VCC, XOR circuitry 60 inverts the output signal of PLC 50, but when the XOR_CTRL output signal of XOR circuitry 130 is GND, XOR circuitry 60 does not invert the output signal of PLC 50.

The FIG. 2 circuitry also allows the XOR_CTRL input of XOR circuitry 60 to be either p-term 20b (line 4 of FIG. 3) or the logical inverse of p-term 20b (line 3 of FIG. 3) based on programmed control. Thus programmed inversion control is not lost (as it is in the case of FIG. 1) when the XOR_CTRL signal is derived from p-term 20b.

Lines 5 and 6 of FIG. 3 show the basic T flip-flop options available with the FIG. 2 circuitry. Lines 7–10 show that these T flip-flop options are not lost when it is desired to use p-term 20b as a logical constituent of the XOR_CTRL signal. In particular, the logical state of p-term 20b can be used to invert or not invert either the Q or Q-bar signal coming from XOR circuitry 120.

The foregoing demonstrates that the circuitry of FIG. 2 has all the capabilities of FIG. 1, plus several capabilities that the FIG. 1 circuitry does not have. In particular, the circuitry of FIG. 2 allows the user to independently choose between D and T flip-flops, inverted or non-inverted input, and p-term 20b.

Figure 4:
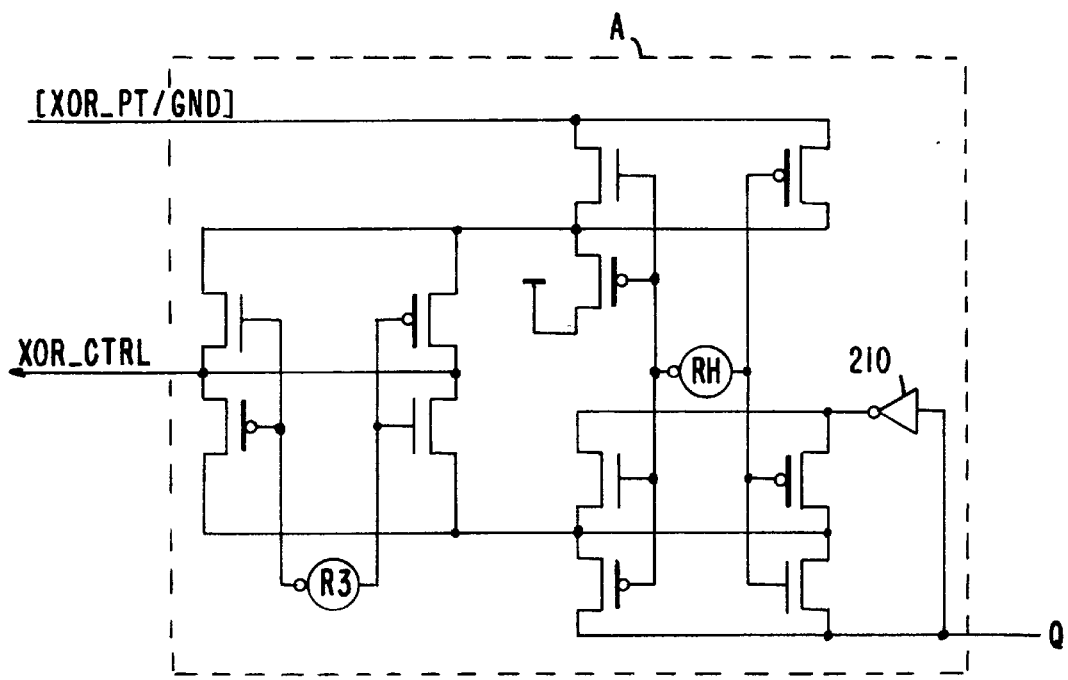
FIG. 4 is a more detailed but still simplified schematic block diagram of a typical implementation of a portion of the FIG. 1 circuitry.
Figure 5:
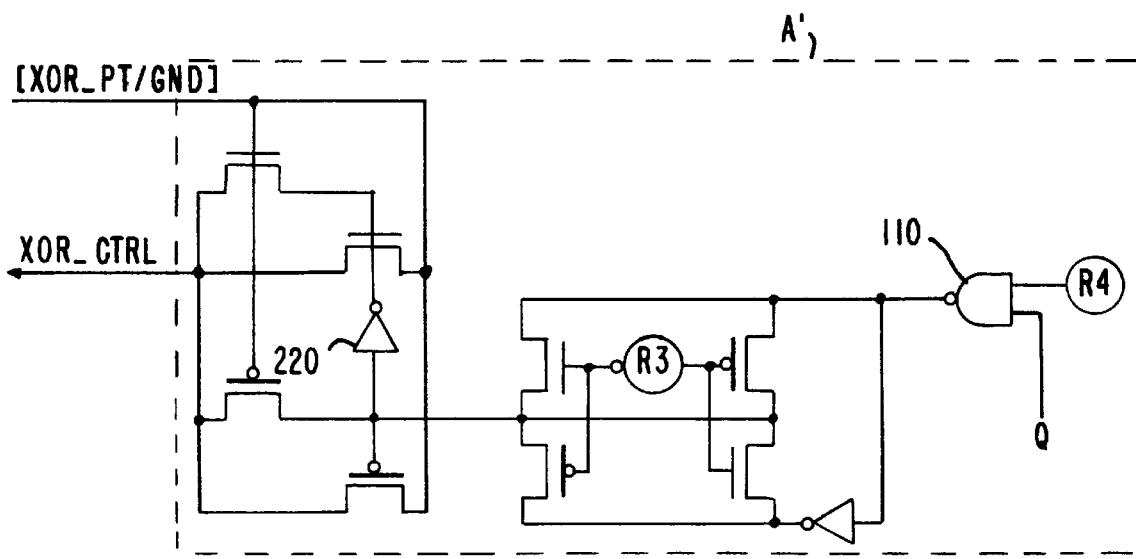
FIG. 5 is a more detailed but still simplified schematic block diagram of an illustrative implementation of a portion of the FIG. 2 circuitry in accordance with the invention.
Figure 6:
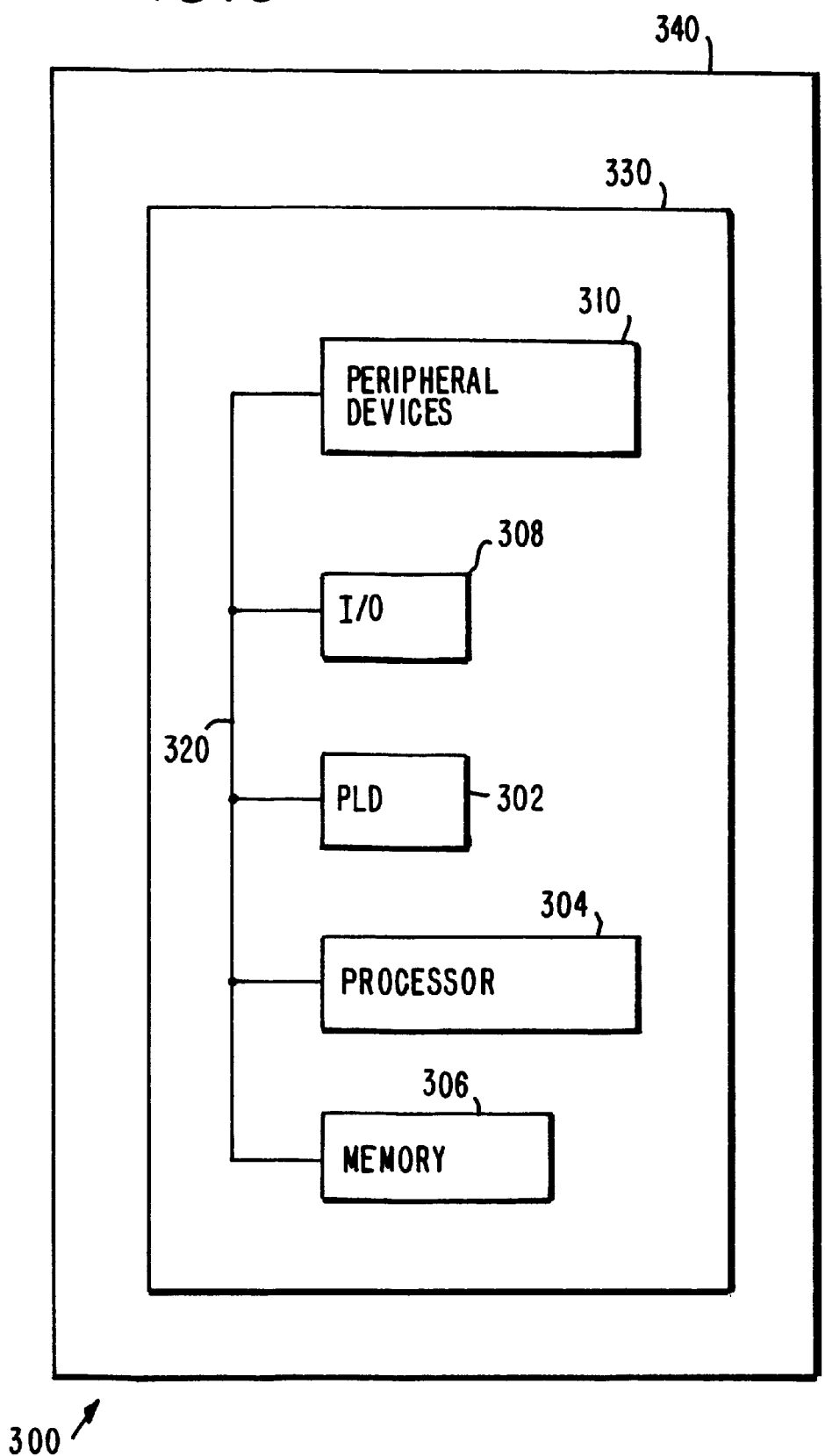
FIG. 6 is a simplified block diagram of an illustrative system employing a programmable logic device incorporating macrocell circuitry in accordance with the invention.

FIGS. 4 and 5 show that the more capable circuitry of FIG. 2 can be constructed using only a small number of transistors greater than the number required to construct the less capable FIG. 1 circuitry. FIG. 4 shows one possible transistor-level implementation of the circuitry A for producing the XOR_CTRL signal in FIG. 1. Not including the control FCEs R3 and R4, this implementation employs 13 transistors (inverter 210 requires two transistors to implement). FIG. 5 shows one possible transistor-level implementation of the circuitry A' for producing the XOR_CTRL signal in FIG. 2. Not including the control FCEs R3 and R4, this implementation employs 16 transistors (NAND circuitry 110 requires four transistors to implement, and inverter 220 requires two transistors to implement). Thus only three more transistors are required to provide circuitry A' for FIG. 2 than are required to provide circuitry A for FIG. 1.

It will be appreciated that the macrocell circuitry of this invention can be used in a variety of contexts. The above-mentioned '006 patent is an example of sum-of-products programmable logic devices in which the present macrocell circuitry can be used. Heile U.S. Pat. No. 6,020,759 shows an example of a programmable logic device which is basically a look-up table logic device, but which has large blocks of random access memory ("RAM") or read-only memory ("ROM") that can be used to perform sum-of-products logic. The macrocell circuitry that augments these RAM or ROM blocks is another example of circuitry that can be implemented as shown herein. The '006 patent and the Heile reference mentioned above are hereby incorporated by reference herein in their entireties.

FIG. 7 illustrates a programmable logic device 302 including macrocell circuitry in accordance with this invention in a data processing system 300. Data processing system 300 may include one or more of the following components: a processor 304; memory 306; I/O circuitry 308; and peripheral devices 310. These components are coupled together by a system bus 320 and are populated on a circuit board 330 which is contained in an end-user system 340.

System 300 can be used in a wide variety of applications, such as computer networking, data networking, instrumentation, video processing, digital signal processing, or any other application where the advantage of using programmable or reprogrammable logic is desirable. Programmable logic device 302 can be used to perform a variety of different logic functions. For example, programmable logic device 302 can be configured as a processor or controller that works in cooperation with processor 304. Programmable logic device 302 may also be used as an arbiter for arbitrating access to a shared resource in system 300. In yet another example, programmable logic device 302 can be configured as an interface between processor 304 and one of the other components in system 300. It should be noted that system 300 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs and other logic circuitry can be controlled by various, programmable, function control elements ("FCEs"). (With certain implementations (e.g., fuses and metal optional links) separate FCE devices may not be required, so that in those cases depiction of FCE devices in the accompanying drawings merely indicates that the circuitry is programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of this invention, and that various modifications can be made by those skilled in the art without departing from the scope and spirit of the invention. For example, the particular signal levels (e.g., logic 0, logic 1, VCC, GND, etc.) mentioned herein are only illustrative, and different signal levels can be used instead if desired. Similarly, the particular types of logic circuits or elements shown herein are only illustrative, and other logically equivalent elements can be used instead if desired.

The invention claimed is:

1. Circuitry configured to allow selection of a control signal from any one of fixed logic 1, fixed logic 0, a non-inverted version of an output signal of a register, an inverted version of the register output signal, a non-inverted version of a data signal, an inverted version of the data signal, a non-inverted version of a logical combination of the data signal and the register output signal, and an inverted version of the logical combination of the data signal and the register output signal, the control signal being usable for logical control of an input signal to the register, comprising:

first and second programmable function control elements;

first logic circuitry configured to produce a first intermediate signal which is a predetermined first logical combination of an output signal of the first function control element and the register output signal;

second logic circuitry configured to produce a second intermediate signal which is a predetermined second logical combination of an output signal of the second function control element and the first intermediate signal; and third logic circuitry configured to produce the control signal as a predetermined third logical combination of the second intermediate signal and a selected one of the data signal and a signal having a fixed logic level.

2. The circuitry defined in claim 1 wherein the first logic circuitry is configured to perform a logical NAND operation on the output signal of the first function control element and the register output signal.

3. The circuitry defined in claim 1 wherein the second logic circuitry is configured to perform a logical EXCLUSIVE OR operation on the output signal of the second function control element and the first intermediate signal.

4. The circuitry defined in claim 1 wherein the third logic circuitry is configured to perform a logical EXCLUSIVE OR operation on the second intermediate signal and the selected one of the data signal and the signal having a fixed logic level.

5. The circuitry defined in claim 1 wherein the fixed logic level is logic 0.

6. The circuitry defined in claim 2 wherein the second logic circuitry is configured to perform a logical EXCLUSIVE OR operation on the output signal of the second function control element and the first intermediate signal.

7. The circuitry defined in claim 6 wherein the third logic circuitry is configured to perform a logical EXCLUSIVE OR operation on the second intermediate signal and the selected one of the data signal and the signal having a fixed logic level.

8. The circuitry defined in claim 7 wherein the fixed logic level is logic 0.

9. The circuitry defined in claim 1 further comprising:
   fourth logic circuitry configured to produce the register input signal as a predetermined fourth logical combination of the control signal and a further signal.

10. The circuitry defined in claim 9 wherein the fourth logic circuitry is configured to perform a logical EXCLUSIVE OR operation on the control signal and the further signal.

11. The circuitry defined in claim 9 further comprising:
    sum-of-products circuitry configured to produce the further signal as the sum of a plurality p-term signals.

12. The circuitry defined in claim 11 wherein the sum-of-products circuitry is further configured to alternatively produce the further signal as a signal having a fixed logic state.

13. The circuitry defined in claim 12 wherein the fixed logic state is logic 0.

14. The circuitry defined in claim 1 further comprising:
    programmable logic connector circuitry configured to programmably select one of the data signal and the signal having a fixed logic level for use by the third logic circuitry.

15. The circuitry defined in claim 1 further comprising:
    p-term circuitry configured to provide a product term signal as the data signal.

16. A programmable logic device including circuitry as defined in claim 1.

17. A digital processing system comprising:
    processing circuitry;
    a memory coupled to said processing circuitry; and
    a programmable logic device as defined in claim 16 coupled to the processing circuitry and the memory.

18. A printed circuit board on which is mounted a programmable logic device as defined in claim 16.

19. The printed circuit board defined in claim 18 further comprising:
    a memory mounted on the printed circuit board and coupled to the programmable logic device.

20. The printed circuit board defined in claim 18 further comprising:
    processing circuitry mounted on the printed circuit board and coupled to the programmable logic device.

* * * * *